United States Patent [19]

Levy et al.

[11] Patent Number: 4,577,114
[45] Date of Patent: Mar. 18, 1986

[54] HIGH POWER OPTICAL SWITCH FOR MICROSECOND SWITCHING

[75] Inventors: Stephen Levy, Ocean; Joseph C. O'Connell, Tinton Falls; William H. Wright, Jr., Neptune; Maurice Weiner, Ocean, all of N.J.

[73] Assignee: The United States of America as represented by the Secretary of the Army, Washington, D.C.

[21] Appl. No.: 611,292

[22] Filed: May 17, 1984

[51] Int. Cl.$^4$ .................. H01J 40/14; H01L 31/00
[52] U.S. Cl. .................. 250/551; 250/211 R; 357/30
[58] Field of Search .......... 250/214 SW, 465.1, 551, 250/229, 211 R; 361/173; 307/311; 357/30

[56] References Cited
U.S. PATENT DOCUMENTS 4,376,285  3/1983  Leonberger et al. ............. 357/61

Primary Examiner—Edward P. Westin
Assistant Examiner—Stephone B. Allen
Attorney, Agent, or Firm—Anthony L. Lane; Jeremiah G. Murray; Edward Goldberg

[57] ABSTRACT

High power optically activated switches of the semiconductor type utilizing a broadbanded flashlamp as the source of light for rendering the semiconductor conductive and thus close the switch. In order that the conductivity of the semiconductor when in the "on" state be uniform over the load current carrying cross-section thereof, the semiconductor is treated to produce a tapered density of trapping or re-combination centers therein, with the density being a maximum at the semiconductor surface which faces the flashlamp. Several novel configurations of these switches are shown, including reflectors for concentrating the flashlamp output on the semiconductor, and a plurality of semiconductor switches all activated by a single light source, as well as liquid cooled semiconductors.

13 Claims, 7 Drawing Figures

HIGH POWER OPTICAL SWITCH FOR MICROSECOND SWITCHING

The invention described herein may be manufactured, used, and licensed by or for the Government for governmental purposes without the payment to us of any royalties thereon.

BACKGROUND OF THE INVENTION

This invention relates to semiconductor type optically activated high voltage, high power switches. Such switches have been developed for use in kilovolt pulser circuits for producing high power pulses with rapid rise and fall times. These optical switches may comprise, for example, a bulk semiconductor wafer with a pair of spaced contacts applied to one of the broad surfaces thereof to define a gap between the contacts. The gap length is chosen to provide a hold-off voltage higher than the voltage to be switched, which is applied across the gap. Application of light energy to the gap area which is sufficiently energetic to cause the formation of charge carriers in the form of electrons and holes (or pairs), will rapidly close the switch and apply the high voltage to a load in series therewith. If the light covers the entire gap area, there is no transit time limitation and the switching action is extremely fast. Also, the switching is accomplished with a low jitter, and has the capability of high pulse repetition frequencies. These switches can also be used as opening switches in which the light activation is rapidly removed to rapidly break the circuit connection, to produce a short fall time for a high power pulse.

These solid state switches have many advantages over prior art switches used for similar purposes, for example, spark gaps, thyratrons and SCRs. High power thyratrons are expensive and require substantial heater power; spark gaps are difficult to build and operate at rates over 200 pps, and both of these type switches have limited lives. SCRs cannot handle high peak currents and voltages. Optically activated bulk semiconductor switches can be scaled up in size to increase current and power handling capacity since no p-n junctions are involved.

In the past lasers have been utilized to illuminate solid state switches, however lasers have certain disadvantages, for example lasers do not ordinarily produce pulses of microsecond or more duration at the required intensity for many switching applications. Also the coherent laser beams can be difficult to diffuse uniformly over the gap area. The present invention overcomes these disadvantages with the use of a broadbanded pulsed light source in the form of a flashlamp, coupled with the use of specially processed semiconductor material.

SUMMARY OF THE INVENTION

The invention in its basic form comprises a block or wafer of suitable semiconductor material provided with contacts to define a gap area which is adapted to be illuminated by a flashlamp which produces a broad spectrum of photon energy. In order to provide substantially uniform switch conductivity when in the "on" state, the bulk semiconductor is provided with trapping centers which can be produced by one or more known techniques. The trapping center density is made highest at the semiconductor surface which faces the incoming photons and the density tapers off toward the interior or opposite side of the semiconductor. This tapered trapping center distribution provides substantially uniform conductivity over the load current carrying cross-section of the semiconductor switch.

The invention also comprises several novel configurations of semiconductor switches with flashlamp light sources.

It is thus an object of the invention to provide an optically activated solid state switch which is capable of microsecond rise times with pulse repetition rates of thousands per second, and wherein the high intensity flashlamp used for switch activation is capable of producing light pulses and hence switch closures up to tens of microseconds duration.

Another object of the invention is to provide a flashlamp activated semiconductor switch in which the bulk semiconductor is treated to produce a tapered profile of trapping centers so that the semiconductor conductivity in the "on" state will be substantially uniform throughout the cross sectional area which carries the load current.

A still further object of the invention is to provide novel light activated semiconductor switches comprising a flashlamp light source, a reflector, a semiconductor switch and cooling means for the semiconductor.

A still further object of the invention is to provide a plurality of light activated semiconductor switches all activated by a single light source.

These and other objects and advantages of the invention will become apparent from the following detailed description and the drawings.

DETAILED DESCRIPTION OF PREFERRED EMBODIMENTS

Figure 1:
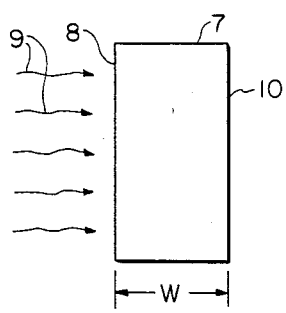
FIGS. 1 and 2 show bulk semiconductor materials of different shapes being illuminated to change the conductivity thereof.

FIG. 1 is an end view of a ribbon or rectangular block type of semiconductor material, 7, of width W, intended for use as an optically activated switch. The activating light beam 9 comes from a light source to the left of the semiconductor. The direction of current flow in such a switch, when in the "on" state would be perpendicular to the plane of the paper of FIG. 1, that is the current may flow into or out of the paper, depending on the current polarity. If the light source 9 of such an optical switch is a flashlamp, the spectral output thereof would necessarily be broadbanded, for example a typical flashlamp output may peak at a wavelength of 0.9 microns in the near infra-red with substantial light output extending throughout the visible portion of the spectrum and into the ultra violet, and in the other direction toward the far infra-red. As stated above, the operation of optically activated semiconductor switches depends on the formation of charge carriers throughout the bulk of the semiconductor by the incident photons of the activating light source. The penetration depth of light into a semiconductor is a function of both the type of semiconductor and the wavelength of the incident light. The shorter wavelength radiation penetrates shorter distances since it more readily gives up energy in creating carrier pairs. Thus if a rectangular semiconductor such as that of FIG. 1 is illuminated by the output 9 of a broadbanded flashlamp, as illustrated, the number of charge carriers produced within the semiconductor 7 would vary, being a maximum near the surface 8 where the incident light 9 is applied and decreasing as one progresses to the opposite face 10, due to the aforementioned spectral characteristics of such a light source. Thus the use of an intrinsic semiconductor in such a switch would result in high semiconductor conductivity when in the "on" state in the portion of the semiconductor near the light source with the conductivity tapering off toward the opposite side. This results in undesirable concentration of the switch load current in this area of high conductivity and can result in localized overheating and consequent damage to the semiconductor.

In accordance with an important aspect of this invention, the performance of such a switch is enhanced by processing the semiconductor material to produce a variable density of trapping centers therein, with the number of such trapping centers being a maximum at the edge of the semiconductor at which the activating light enters and tapering off in the direction of the path of the said light through the semiconductor. Trapping centers reduce the number of charge carriers in the semiconductor lattice by providing re-combination centers for the electrons and holes. Thus these re-combination centers decrease the conductivity and by tapering the number of trapping or re-combination centers in the same way as the intrinsic conductivity of the semiconductor is tapered, the conductivity will be rendered uniform across the current carrying cross-section of the switch. This technique of course results in loss of the photon energy which produced the recombined charge carriers, however this is not a serious drawback in that the light output of a typical flashlamp is high enough to tolerate this loss.

Figure 1A:
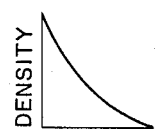
FIG. 1A is a curve showing the distribution of trapping centers within the semiconductor of FIG. 1.

The curve of FIG. 1A shows how the trapping center density may vary across the semiconductor of FIG. 1. Different semiconductors exhibit different patterns of conductivity even when illuminated by the same broadbanded light source, thus the trapping center distribution or tapering pattern to achieve uniform conductivity will be a function of both the semiconductor material and the light source spectrum as well as the light intensity.

The production of the trapping centers in the semiconductor crystal lattice can be accomplished by doping. For example, an intrinsic GaAs bulk semiconductor can be doped with chromium by a diffusion process wherein the gaseous dopant would be applied to the surface of the semiconductor where the highest trapping center density is required. Thus the diffusion would be through the surface 8 of the semiconductor 7 of FIG. 1. An alternate method of producing trapping centers is by ion bombardment with ions of the dopant or with any ions which will produce damage sites which can function as trapping centers.

Figure 2:
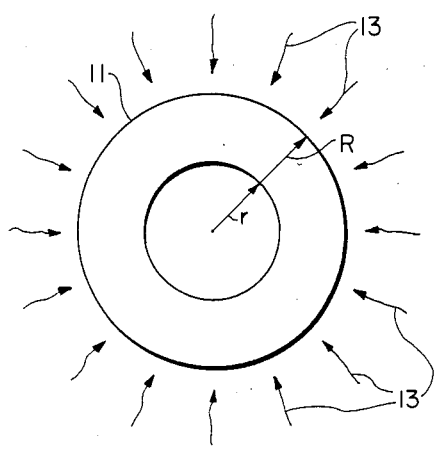

FIG. 2 shows another configuration of a switch to which this invention can be applied. The semiconductor material 11 is in the form of a hollow cylinder of outside radius R with a central bore therein of radius r. Such a semiconductor switch can be illuminated by means of light beams 13 which strike the outside curved surface thereof along radii of the cylinder 11. Such illumination for example may be provided by a helical flashlamp which is wrapped around the cylinder 11. Such a cylindrical switch would have a maximum trapping center density near the outside radius thereof with the density tapering appropriately toward the inner radius, r. In such a hollow cylindrical switch, a coolant liquid may be circulated through the bore thereof. If cooling is not needed, the cylinder can be made solid.

Figure 3:
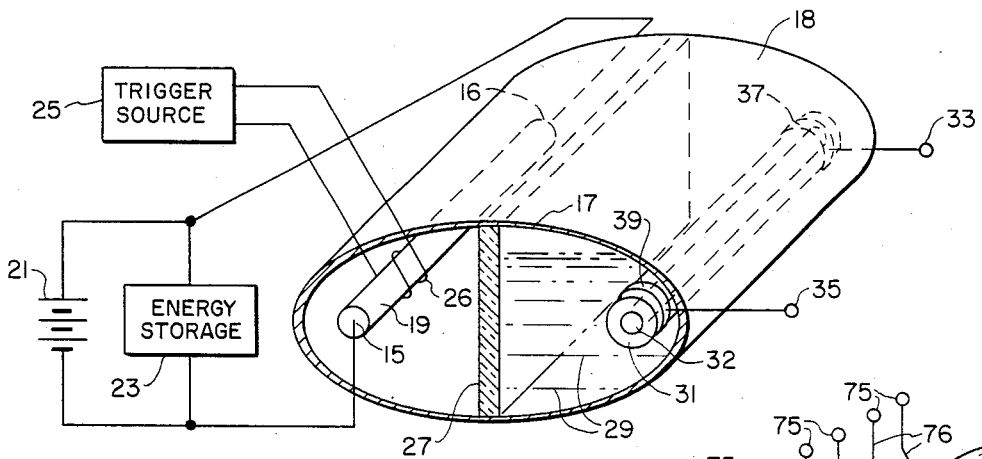
FIGS. 3 and 4 show different arrangements of flashlamp activated semiconductor switches.

FIG. 3 shows one novel embodiment of a flashlamp activated semiconductor switch in accordance with the present invention. This switch comprises a hollow cylindrical semiconductor 31, like that of FIG. 2 and similarly provided with a trapping center density which decreases from the outside of the cylinder toward the bore 32 thereof. A pair of metal contacts 37 and 39 encircle the cylinder near the opposite ends thereof and are connected by leads to switch terminals 33 and 35. The semiconductor 31 and the flashlamp 19 are arranged parallel to each other and are both enclosed in a cylindrical enclosure 18 which may have an elliptical cross-section 17. The enclosoure 18 may be fabricated of sheet metal and has a highly reflective interior so that the flashlamp output will be concentrated on and uniformly distributed around the exterior of the semiconductor cylinder 31. The flashlamp 19 may be located at or near one of the foci of the ellipse 17 and the semiconductor 31 at or near the other focus thereof. A filter 27 is arranged to filter out harmful ultra-violet wavelengths in the flashlamp output and may also be arranged to filter the longer wavelength infra-red components of wavelength 2.0 microns or more which have limited carrier production capability. Also the half of the elliptical cylinder in which the semiconductor 31 is located may have a cooling liquid 29 flowing therein. This coolant should be a dielectric liquid such as ethelyne glycol. The flashlamp is energized by a conventional power supply which may comprise a battery 21, and energy storage means 23 connected to the flashlamp electrodes 15 and 16. A high voltage pulse from trigger source 25 is applied to trigger wire 26 to initiate ionization of the flashlamp. The trigger wire may be simply wrapped around the outside of the flashlamp once or twice. The trigger source 25 determines the pulse repetition rate and "on" time of the flashlamp and of the semiconductor switch.

Figure 4:
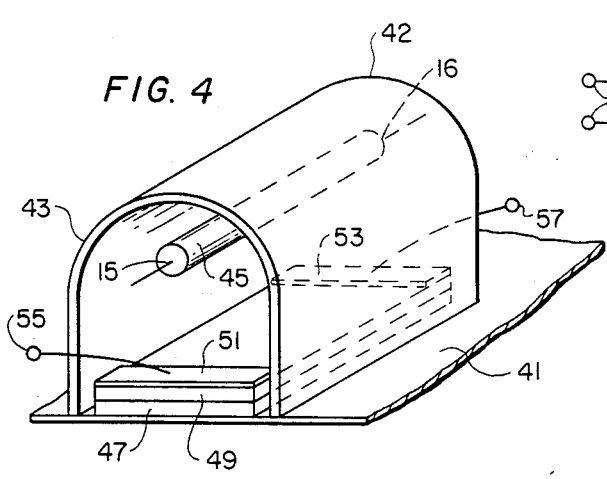

FIG. 4 shows how a ribbon type semiconductor switch of this type can be incorporated into a stripline, and fitted with a parabolic reflector to concentrate the output of the flashlamp 45 onto the gap area of the semiconductor. The structure of FIG. 4 includes a ground plane 41, an insulating substrate 47 on which the ribbon type semiconductor 49 is mounted. The semiconductor would have a tapered density of trapping centers therein with the highest density at its upper surface facing the flashlamp 45. A pair of spaced metal contacts 51 and 53 are applied to the upper surface semiconductor and are connected by leads 55 and 57 to the switch terminals. A reflector 42 has its upper portion 43 in the shape of a parabola, and is mounted over the switch and the flashlamp and the flashlamp is supported at the focus of the parabola 43, so that the light reflected from the highly reflective inner surface of the parabolic reflector will be directed downward in collimated rays toward the gap area of the switch between the contacts 51 and 53.

Figure 5:
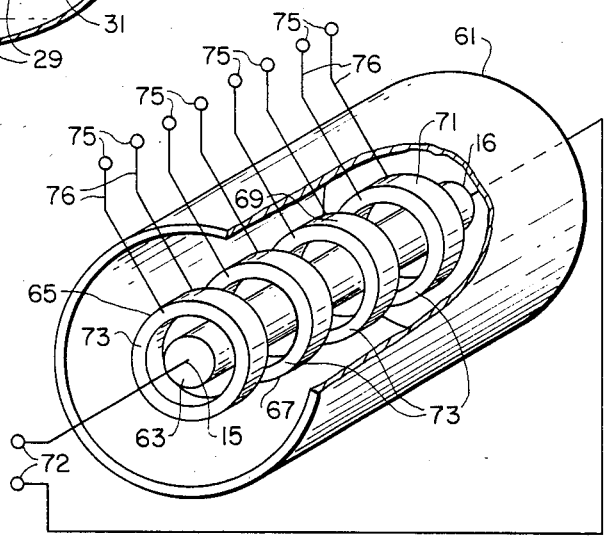
FIG. 5 shows an embodiment of the invention wherein several semiconductor switches can be simultaneously activated by a single light source.

FIG. 5 shows how several separate semiconductor switches can be activated simultaneously by a single flashlamp. The single flashlamp 63 is mounted along the axis of a hollow cylindrical reflector 61 which may be made of sheet metal with a highly reflective inner surface. Coaxially mounted around the flashlamp are four separate short hollow cylindrical semiconductor switches, 65, 67, 69, and 71. These switches are spaced from each other so that the light from the flashlamp from the areas between the semiconductor cylinders will be reflected from the inside of the reflector cylinder 61 and illuminate the outer curved surfaces of the semiconductor cylinders. Thus the semiconductors are illuminated from the outside by the reflected light and from the inside out by the light received directly from the flashlamp 63. For this reason these cylinders must be provided with trapping center densities which are a maximum at the inside curved surface and also at the outside curved surface, with the densities both decreasing to a minimum somewhere between these two curved surfaces. The flashlamp is energized from a power supply applied to terminals 72 which are connected to the flashlamp terminals 15 and 16. A trigger wire like that of FIG. 3 may be used to initiate ionization.

Figure 6:
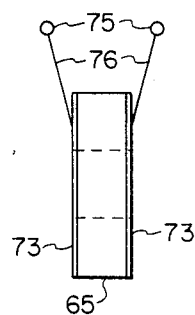
FIG. 6 shows details of one of the semiconductor switches of FIG. 5.

A pair of switch terminals 75 are provided for each one of the four semiconductor switches of FIG. 5. These terminals are connected to metal contacts 73 on the opposite flat surfaces of each of the semiconductor cylinders. FIG. 6 shows one of these cylinders, 65, with the leads 76 from terminals 75 connected to metal contacts 73 on each flat end thereof.

A multiple switch like that of FIG. 5 is useful in a Marx circuit where each switch must simultaneously close in order to deliver a voltage pulse n times larger than that possible from a single switch, where n is the number of switches.

The semiconductor material for the switches of these types may be any material with the required band gap and a high "off" state resistance and which can be doped or bombarded to provide the required trapping center density. Suggested semiconductors which meet these requirements are gallium arsenide, silicon, indium phosphide, and germanium.

In the embodiment of FIG. 3, the filter 27 can be replaced or supplemented by a fast acting electronic shutter arranged to close rapidly to cut off the light to the semiconductor 31. This would provide an opening switch operating mode as opposed to a closing switch mode.

Among the many advantages of the novel switches disclosed herein are: high current carrying capacity up to tens or even hundreds of kiloamperes with pulse durations of microseconds to hundreds of microseconds, with the hold-off voltage being a function of active switch length only. Also the flashlamp pump or power supply circuit is electrically isolated from the high voltage load circuit. Rise times can be as short as fractions of microseconds for long pulses and the switch repetition rates can vary from a single shot to kilo hertz rates. Also the disclosed switches facilitate efficient cooling which permits high power operation at high repetition rates. Further, the use of high intensity flashlamps can produce high switch "on" and "off" resistance ratios up to $10^{10}$, with "on" resistance of one milliohm and with "off" resistance of 10 megohms.

While the invention has been described in connection with illustrative embodiments, obvious variations therein will occur to those skilled in this art, accordingly the invention should be limited only by the scope of the appended claims.

We claim:

1. A semiconductor type optically activated switch; comprising a bulk semiconductor with a pair of contacts mounted thereon to define a gap between said contacts, means to illuminate said gap to render said bulk semiconductor conductive, said means to illuminate comprising a broadbanded flashlamp, said bulk semiconductor having been processed to provide a tapered density of trapping centers therein, with said trapping center density being the highest at the semiconductor surface which faces the incoming light from said flashlamp, and wherein said tapered density of said trapping centers is chosen to yield substantially uniform conductivity over the load current carrying cross-section of said bulk semiconductor.

2. The switch of claim 1 wherein said bulk semiconductor is a rectangular block with the light from said flashlamp arranged to strike one of the broad faces thereof.

3. The switch of claim 1 wherein said bulk semiconductor is a cylinder and wherein said flashlamp is in a helical shape and is wrapped around said cylinder, and wherein said contacts comprise a pair of spaced metal bands on the curved surface of said cylinder.

4. The switch of claim 3 wherein said cylinder has a hollow axial bore therein adapted to accommodate a coolant liquid.

5. An optically activated semiconductor switch comprising; a bulk semiconductor of cylindrical shape and a cylindrical flashlamp both mounted parallel to each other inside of a hollow cylindrical housing with an elliptical cross-section, said semiconductor and said flashlamp being located near the foci of said elliptical cross-section, said housing having a reflective interior surface, said semiconductor having a pair of contacts which encircle it near the opposite ends thereof, said semiconductor being provided with a tapered density of trapping centers, said density being maximum at the outer curved surface thereof and tapering off toward the cylindrical axis thereof, whereby the conductivity of said semiconductor when in the "on" state will be substantially uniform throughout the circular cross-section thereof.

6. The switch of claim 5 wherein said bulk semiconductor has an axial bore therein and wherein a coolant is circulated around said semiconductor.

7. The switch of claim 5 further comprising a filter mounted within said housing between said flashlamp and said bulk semiconductor, said filter chosen to block undesired wavelengths in the output of said flashlamp.

8. The switch of claim 5 further comprising an electronic shutter mounted within said housing between said flashlamp and said bulk semiconductor, said shutter arranged to be closed rapidly to cut off the light to said semiconductor.

9. A stripline type semiconductor, optically activated switch comprising; a conductive ground plane with an insulated substrate thereon, a ribbon type bulk semiconductor mounted on said substrate, a pair of metal contacts applied to the upper surface of said bulk semiconductor to define a gap therebetween, said bulk semiconductor having a tapered density of trapping centers therein with said density being maximum at said upper surface thereof, and a flashlamp mounted above said gap to provide illumination for said gap.

10. The switch of claim 9 further comprising a parabolic reflector mounted over said gap and said flashlamp with said flashlamp located at the focus of said reflector.

11. A multiple semiconductor switch device, comprising a flashlamp mounted along the axis of a hollow cylindrical reflector, with a plurality of separate short, hollow cylindrical bulk semiconductors mounted around said flashlamp and spaced from each other, said semiconductors comprising contacts mounted on opposite flat end faces of said bulk semiconductors, said bulk semiconductors being provided with trapping center densities which are a maximum at both the inside and outside curved surfaces thereof, with both said densities decreasing to a minimum somewhere between the two curved surfaces.

12. An optically activated switch comprising a bulk semiconductor with a pair of contacts mounted thereon to define a gap therebetween, a broadbanded flashlamp adapted to illuminate said gap and to produce charge carriers therein, whereby said switch will be rendered conductive, and wherein said bulk semiconductor in the area of said gap has been processed to produce a tapered density of trapping centers within said bulk semiconductor, with the maximum of said density at the surface of said semiconductor which faces said flashlamp, with the said density decreasing along the path of the light from said flashlamp as it passes through said semiconductor.

13. The switch of claim 12 wherein said tapered density of trapping centers is chosen to provide a substantially uniform conductivity across the load current carrying cross-section of said bulk semiconductor.

* * * * *